(12) United States Patent
Miyatake (10) Patent No.: US 10,770,462 B2
(45) Date of Patent: Sep. 8, 2020

(54) CIRCUIT AND LAYOUT FOR SINGLE GATE TYPE PRECHARGE CIRCUIT FOR DATA LINES IN MEMORY DEVICE

(71) Applicant: Micron Technology, Inc., Boise, ID (US)

(72) Inventor: Shinichi Miyatake, Chuo-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/197,185

(22) Filed: Nov. 20, 2018

(65) Prior Publication Data

US 2019/0088654 A1   Mar. 21, 2019

Related U.S. Application Data

(62) Division of application No. 15/293,554, filed on Oct. 14, 2016, now Pat. No. 10,163,906.

(51) Int. Cl.

| | |
|---|---|
| *H01L 27/108* | (2006.01) |
| *G11C 11/4091* | (2006.01) |
| *G11C 11/4076* | (2006.01) |
| *G11C 5/02* | (2006.01) |
| *G11C 7/08* | (2006.01) |
| *G11C 11/4074* | (2006.01) |
| *G11C 11/4094* | (2006.01) |

(Continued)

(52) U.S. Cl.
CPC ............ *H01L 27/108* (2013.01); *G11C 5/025* (2013.01); *G11C 7/08* (2013.01); *G11C 11/4074* (2013.01); *G11C 11/4076* (2013.01); *G11C 11/4091* (2013.01); *G11C 11/4094* (2013.01); *G11C 11/4097* (2013.01); *H01L 27/11286* (2013.01)

(58) Field of Classification Search
CPC . H01L 27/108; H01L 27/10897; H01L 27/11; H01L 27/1116; H01L 27/1104; H01L 27/1052; G11C 11/4091; G11C 11/4096; G11C 11/4076

See application file for complete search history.

(56) References Cited

U.S. PATENT DOCUMENTS

2014/0022857 A1   1/2014  Miyatake
2018/0108398 A1   4/2018  Miyatake

OTHER PUBLICATIONS

"U.S. Appl. No. 15/293, Response filed Sep. 14, 2017 to Restriction Requirement dated Jul. 14, 2017", 8 pgs.

(Continued)

*Primary Examiner* — Laura M Menz
*Assistant Examiner* — Candice Chan
(74) *Attorney, Agent, or Firm* — Schwegman Lundberg & Woessner, P.A.

(57) ABSTRACT

Some embodiments include apparatus and methods using a first diffusion region, a second diffusion region, a third diffusion region, and a fourth diffusion region; a first channel region located between a portion of the first diffusion region and a portion of the third diffusion region; a second channel region located between the portion of the third diffusion region and a portion of the second diffusion region; a third channel region located between the portion of the second diffusion region and a portion of the fourth diffusion region; and a gate located over the first, second, and third channel regions. The first and second diffusion regions are located on a first side of the gate. The third and fourth diffusion regions are located on a second side of the gate opposite from the first side.

20 Claims, 10 Drawing Sheets

(51) Int. Cl.
*G11C 11/4097* (2006.01)
*H01L 27/112* (2006.01)

(56) References Cited

OTHER PUBLICATIONS

"U.S. Appl. No. 15/293,554, Non Final Office Action dated Jan. 16, 2018", 10 pgs.
"U.S. Appl. No. 15/293,554, Notice of Allowance dated Sep. 21, 2018", 9 pgs.
"U.S. Appl. No. 15/293,554, Response filed Apr. 16, 2018 to Non Final Office Action dated Jan. 16, 2018", 9 pgs.
"U.S. Appl. No. 15/293,554, Restriction Requirement dated Jul. 14, 2017", 6 pgs.

CIRCUIT AND LAYOUT FOR SINGLE GATE TYPE PRECHARGE CIRCUIT FOR DATA LINES IN MEMORY DEVICE

BACKGROUND

Memory devices are widely used in computers and many electronic items. A memory device has numerous memory cells to store information, and data lines to carry information (e.g., in the form of signals) to be stored in or read from the memory cells. A memory device also has circuitry (e.g., sensing and precharge circuitry) to charge the data lines to a particular voltage during some operations of the memory device. Different memory devices usually have different configurations (e.g., layouts and circuit elements) for such circuitry. Such sensing and precharge circuitry can occupy substantial space on a memory device die, which is disadvantageous. In many cases, attempts to reduce the space required for sensing and precharge circuitry have met with only limited success.

DETAILED DESCRIPTION

Figure 1:
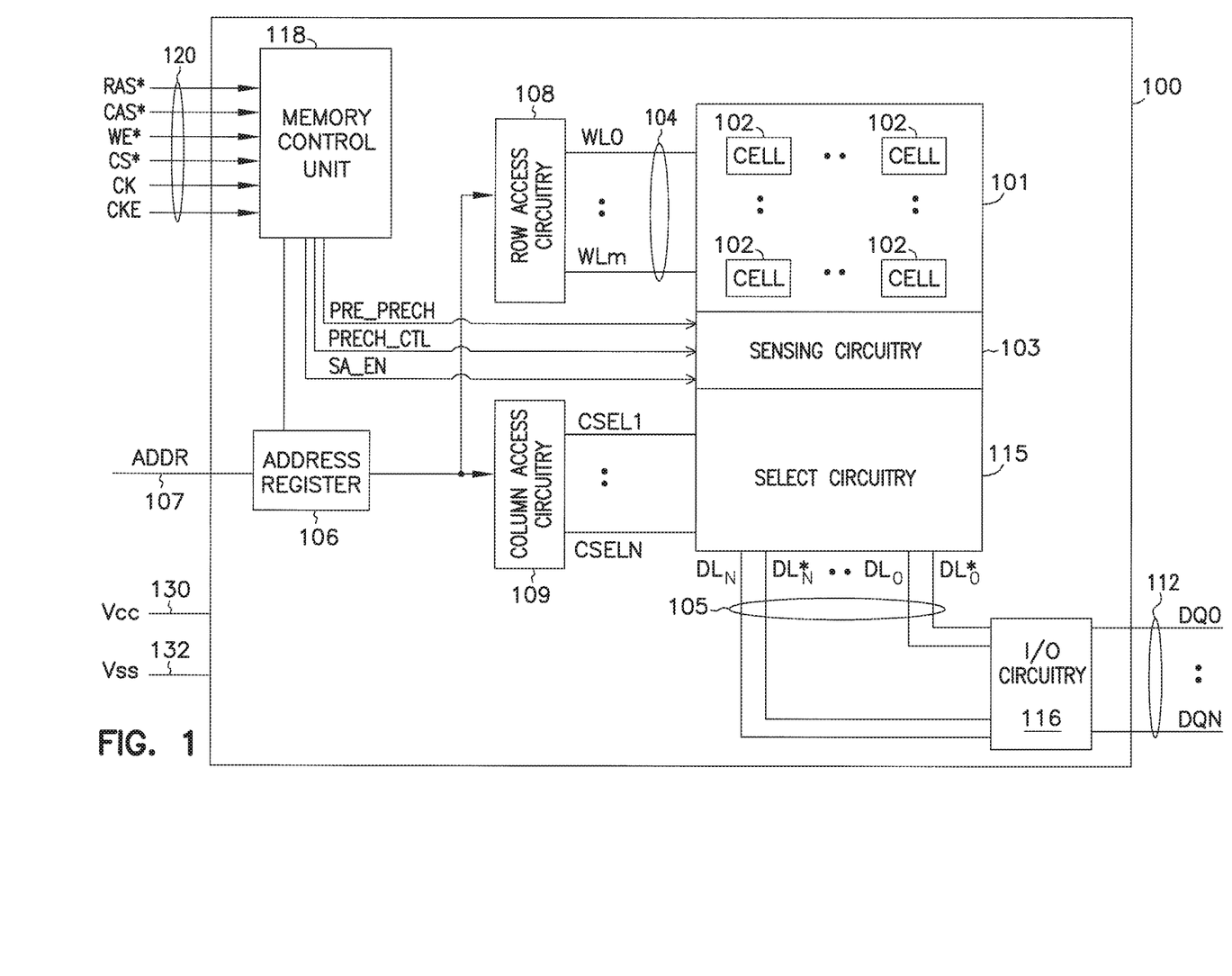
FIG. 1 shows a block diagram of an apparatus in the form of a memory device including sensing circuitry, according to some embodiments described herein.

FIG. 1 shows a block diagram of an apparatus in the form of a memory device 100 including sensing circuitry 103, according to some embodiments described herein. Memory device 100 can include a device portion 101 that includes memory cells 102 and sensing circuitry 103. Memory cells 102 can be arranged in rows and columns in one or more memory cell arrays. Memory device 100 can include access lines 104 (or "word lines") and data lines (e.g., local data lines) 105. Access lines 104 carry signals (e.g., word line signals) WL0 through WLm. Data lines 105 carry signals $DL_0$ and $DL_0^*$ through $DL_N$ and $DL_N^*$. Memory device 100 uses access lines 104 to access memory cells 102 and data lines 105 to provide information (e.g., data) to be stored in (e.g., written) or sensed (e.g., read) from memory cells 102.

Memory device 100 can include an address register 106 to receive address information ADDR (e.g., row address signals and column address signals) on lines (e.g., address lines) 107. Memory device 100 can include row access circuitry 108 and column access circuitry 109 that can operate to decode address information ADDR from address register 106. Based on decoded address information, memory device 100 can determine which memory cells 102 are to be accessed during a memory operation. Memory device 100 can perform a read operation to read (e.g., sense) information (e.g., previously stored information) in memory cells 102 and a write operation to store information in memory cells 102.

In a memory operation of memory device 100, sensing circuitry 103 can operate to provide (e.g., precharge) selected bit lines 105 with particular (known) precharge voltages during a precharge phase of the memory operation. After the precharge phase, information to be stored in memory cells 102 (e.g., in a write operation), or information read from memory cells 102 (e.g., in a read operation) can be based on the values of voltages on the selected bit lines. Part of the operation and structure (e.g., circuit layout) of sensing circuitry 103 of memory device 100 can be similar to, or identical to, those of the memory devices described in more detail with reference to FIG. 2 through FIG. 10.

As shown in FIG. 1, memory device 100 can receive a supply voltage, including supply voltages Vcc and Vss on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

Memory device 100 can include a memory control unit 118 to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a dynamic random access memory (DRAM) device. During memory operations of memory device 100, memory control unit 118 can generate control signals SA_EN (e.g., sense amplifier enable signal), PRE_PRECH (pre-precharge control signal), and PRECH_CTL (precharge control signal) that can be used by sensing circuitry 103. The functions of signals SA_EN, PRE_PRECH, and PRECH_CTL can be similar to, or identical to, the signals of the memory devices described in more detail below with reference to FIG. 2 through FIG. 10.

As shown in FIG. 1, memory device 100 can include lines (e.g., global data lines) 112 that can carry signals DQ0 through DQN. In a read operation, the value (e.g., logic 0 and logic 1) of information (read from memory cells 102) provided to lines 112 (in the form signals DQ0 through DQN) can be based on the values of signals $DL_0$ and $DL_0^*$ through $DL_N$ and $DL_N^*$ on data lines 105. In a write operation, the value of the information provided to data lines 105 (to be stored in memory cells 102) can be based on the values of signals DQ0 through DQN on lines 112.

Memory device 100 can include select circuitry 115 and input/output (I/O) circuitry 116. Column access circuitry 109 can selectively activate signals CSEL0 through CSELN based on address signals ADDR. Select circuitry 115 can respond to select signals CSEL0 through CSELN to select signals $DL_0$, $DL_0^*$, $DL_N$, and $DL_N^*$ (which represent the values of information to be stored in or read from memory cells 102).

I/O circuitry 116 can operate to provide information read from memory cells 102 to lines 112 (e.g., during a read operation) and to provide information from lines 112 (e.g., provided by an external device) to data lines 105 be stored in memory cells (e.g., during a write operation). Lines 112 can include nodes within memory device 100 or pins (or solder balls) on a package where memory device 100 can reside. Other devices external to memory device 100 (e.g., a memory controller or a processor) can communicate with memory device 100 through lines 107, 112, and 120.

As shown in FIG. 1, data lines 105 can include line pairs (e.g., data line pairs), such as a line pair associated with signals $DL_0$ and $DL_0^*$ and a line pair associated with signals $DL_N$ and $DL_N^*$. The signals associated with each of the line pairs of data lines 105 can have different values (e.g., complementary values such as logic 0 and logic 1). For example, signals $DL_0$ and $DL_0^*$ can have different values (e.g., complementary values), such that one of the values may correspond to a true value (e.g., logic 0) of information (to be stored in or read from a selected memory cell), and the other value may correspond to a complementary value (e.g., logic 1) of the information. For example, in a read operation of memory device 100, signal $DL_0$ and $DL_0^*$ can be used to present true and complementary values of the information read from a selected memory cell among memory cells 102, and signals $DL_N$ and $DL_N^*$ signals can be used to present true and complementary values of the information read from another selected memory cell among memory cells 102. In this example read operation, I/O circuitry 116 can provide signals DQ0 and DQN on lines 112, such that the value of signal DQ0 (e.g., based on the values of signals $DL_0$ and $DL_0^*$) and the value of signal DQN (e.g., based on the values of signals $DL_N$ and $DL_N^*$) can correspond to the true values of the information read from the selected memory cells among memory cells 102.

Memory device 100 may include a DRAM device, a static random access memory (SRAM) device, a FLASH memory device, other memory devices, or a combination of these memory devices. Memory device 100 may include other components, which are not shown to help focus on the embodiments described herein. Memory device 100 can be configured to include at least a portion of the memory device with associated structures (e.g., layout) and functions described below with reference to FIG. 2 through FIG. 10.

Figure 2:
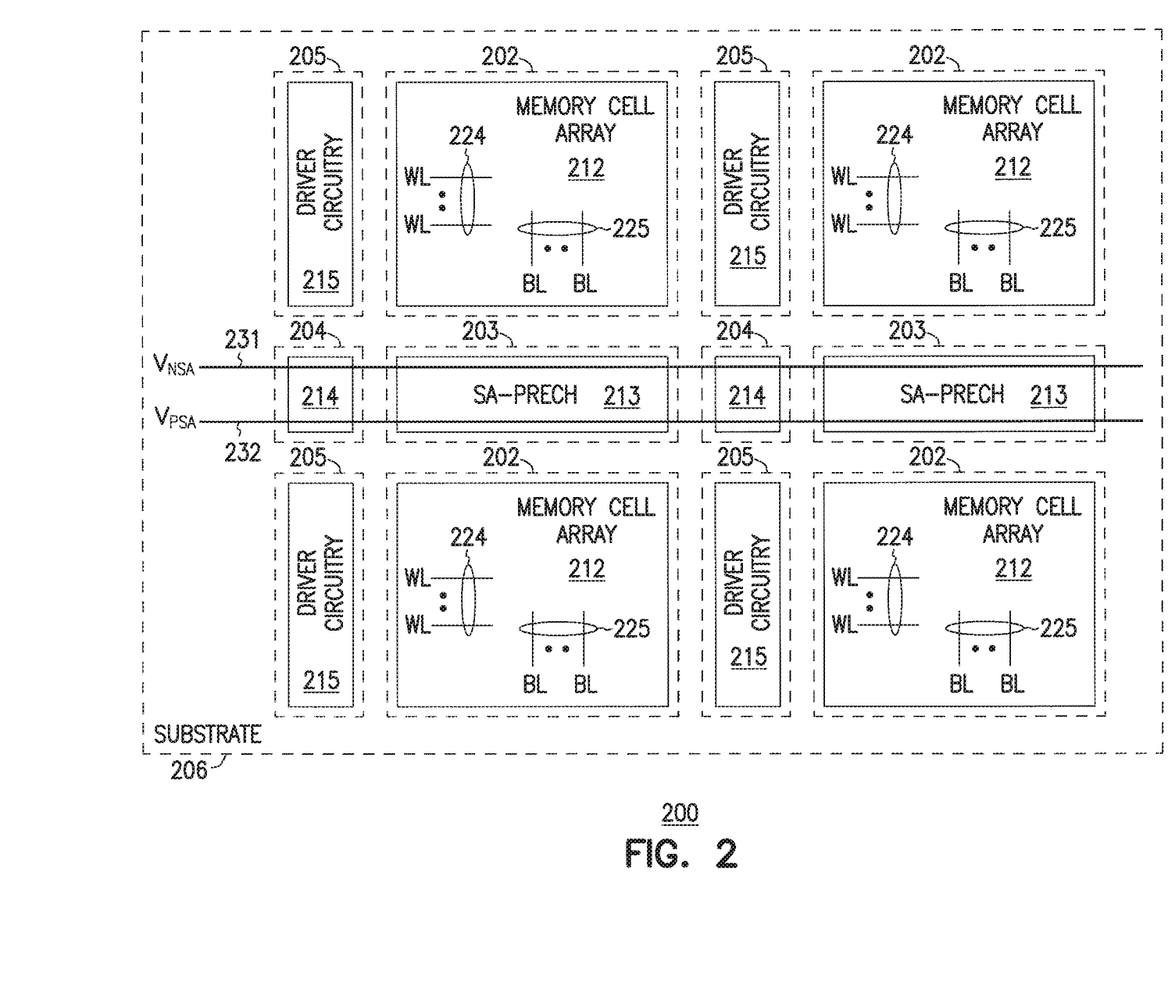
FIG. 2 shows a layout of a memory device, including locations (e.g., device areas) and associated circuitry of the memory device, according to some embodiments described herein.

FIG. 2 shows a layout of a memory device 200 including locations (e.g., device areas) 202, 203, 204, and 205 and associated circuitry, according to some embodiments described herein. In the physical structure of memory device 200, locations 202, 203, 204, and 205 are portions of memory device 200 (e.g., viewed from a top view of memory device 200) where components of memory device 200 are located (e.g., formed in or formed on a substrate 206 (e.g., a semiconductor substrate) of memory device 200). For example, memory device 200 can include memory cell arrays 212 located at locations 202, sense amplifier and precharge circuitry (SA-PRECH) 213 located at locations 203, voltage switch circuitry 214 located at locations 204, and driver circuitry (e.g., word line driver circuitry) 215 located at locations 205.

Memory device 200 can include access lines 224 (e.g., word lines) 224 and bit lines 225 located at each of locations 202. Each of access lines 224 can carry a signal WL (e.g., word line signal) and can have a length extending in one direction. Each of bit lines 225 can carry a signal BL (e.g., bit line signal) and can have a length extending in another direction that can be substantially perpendicular to the length of each of access lines 224. Each of memory cell arrays 212 can include memory cells (e.g., DRAM memory cells, not shown in FIG. 2). Memory device 200 can use access lines 224 at a particular location 202 (among locations 202) to access the memory cells of memory cell array 212 at that particular location. Memory device 200 can use bit lines 225 at a particular location 202 (among locations 202) to carry information to be store in or read from the memory cells of memory cell array 212 at that particular location.

Memory device 200 can correspond to memory device 100 of FIG. 1 and include components similar to those of memory device 100 of FIG. 1. For simplicity, FIG. 2 omits other locations of memory device 200 (where other components of memory device 200 are located) so as to not obscure the embodiments described herein. The components of memory device 200 can correspond to some of the components of memory device 100. For example, the memory cells in each of memory cell arrays 212 of memory device 200 can be similar to memory cells 102 (FIG. 1). Access lines 224 of memory device 200 can be similar to access lines 104 (FIG. 1). Sense amplifier and precharge circuitry 213 and voltage switch circuitry 214 can be part of sensing circuitry of memory device 200 that can correspond to sensing circuitry 103 (FIG. 1). Driver circuitry 215 can be part of row access circuitry of memory device 200 that can be similar row access circuitry 108 (FIG. 1).

As shown in FIG. 2, memory device 200 can include lines 231 and 232. Each of lines 231 and 232 can be structured as a conducive line that can include a conductive material (or materials) formed over substrate 206. Each of lines 231 and 232 can have a length extending in the same direction among locations 203 and 204. The length of each of lines 231 and 232 can also extend in the same direction as the length of each of access lines 224.

Lines 231 and 232 can carry signals $V_{NSA}$ and $V_{PSA}$. Signals $V_{NSA}$ and $V_{PSA}$ can be voltage signals. The value of the voltage provided by signal $V_{NSA}$ can be different from the value of the voltage provided by signal $V_{PSA}$.

During a memory operation (e.g., read or write operation), memory device 200 can provide different voltages on line 231 at different time intervals, depending on which phase of a memory operation that memory device 200 performs at a particular time interval. Similarly, during a memory operation (e.g., read or write operation), memory device 200 can provide different voltages on line 232 at different time intervals, depending on which phase of the memory operation that memory device 200 performs at a particular time interval. The voltages provided on lines 231 and 232 (through signals $V_{NSA}$ and $V_{PSA}$, respectively) can be used by sense amplifier and precharge circuitry 213 of memory device 200 during memory operations of memory device 200.

Figure 3:
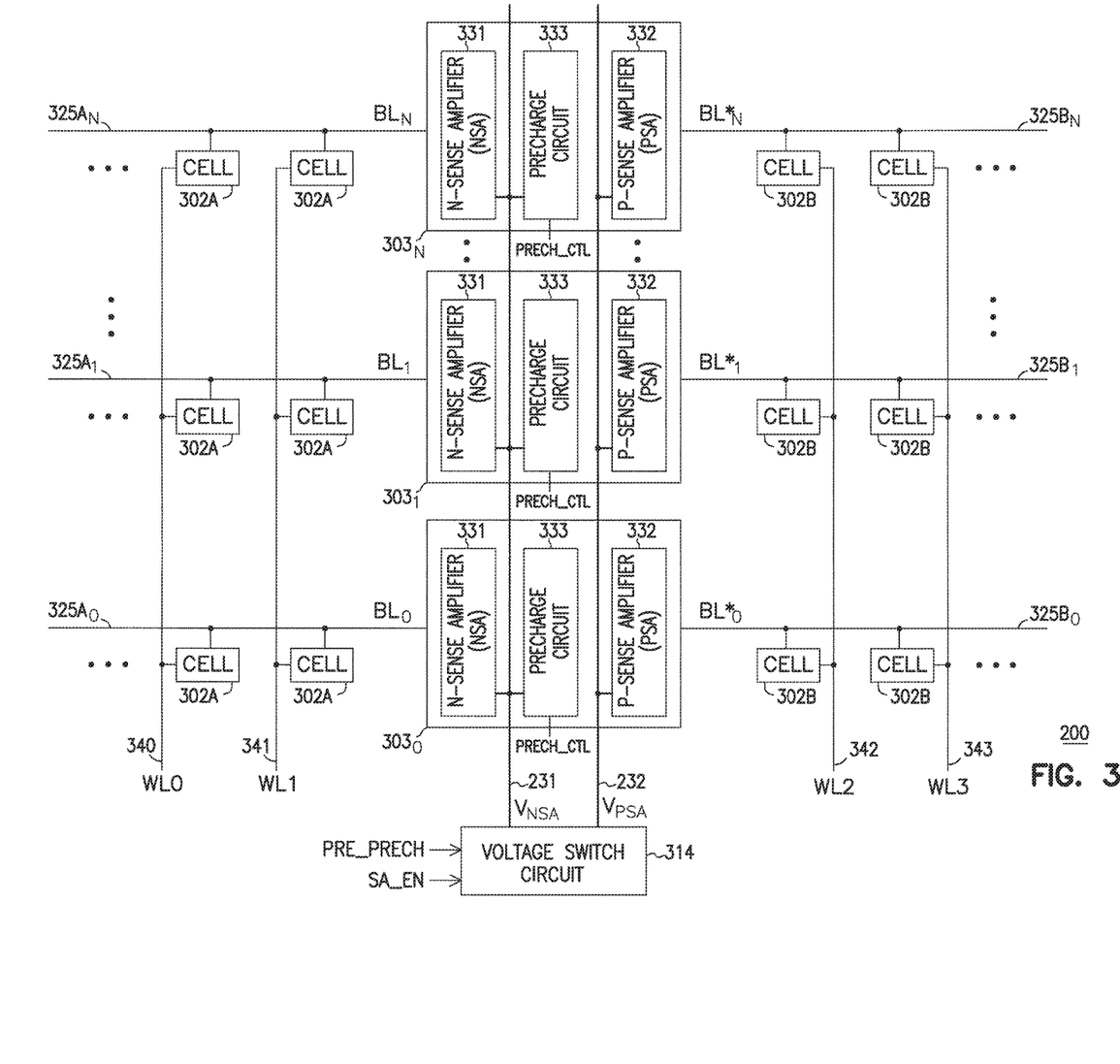
FIG. 3 shows a schematic diagram of a portion of the memory device of FIG. 2 including circuitry portions of sense amplifier and precharge circuitry of FIG. 2, according to some embodiments described herein.

FIG. 3 shows a schematic diagram of a portion of a memory device 200 having circuitry portions $303_0$, $303_1$, and $303_N$ that can be part of sense amplifier and precharge circuitry 213 of FIG. 2, according to some embodiments described herein. FIG. 3 also shows a voltage switch circuit 314 that can be part of voltage switch circuitry 214 of FIG. 2. As shown in FIG. 3, memory device 200 can include memory cells 302A and 302B that can be included in one or more of memory cell arrays 212 (FIG. 2) of memory device 200. For example, memory cells 302A can be included in one of memory cell array 212, and memory cells 302B can be included in another one of memory cell array 212 of FIG. 2. In another example, memory cells 302A can be included in only one of memory cell arrays 212 of FIG. 2.

As shown in FIG. 3, memory device 200 can include access lines 340, 341, 342, and 343 that can carry signals (e.g., word line signals) WL0, WL1, WL2, and WL3, and bit lines $325A_0$, $325A_1$, $325A_N$, $325B_0$, $325B_1$, and $325B_N$ that can carry signals (e.g., bit line signals) $BL_0$, $BL_0^*$, $BL_1$, $BL_1^*$, and $BL_N$, $BL_N^*$. Access lines 340, 341, 342, and 343 can correspond to some of access lines 104 of FIG. 1.

Memory device 200 can use access lines 340 and 341 to access memory cells 302A and access lines 342 and 343 to access memory cells 302B. Memory device 200 can use bit lines $325A_0$, $325A_1$, $325A_N$, $325B_0$, $325B_1$, and $325B_N$ to provide information to be stored in memory cells 302A and 302B, or information read (e.g., sensed) from memory cells 302A and 302B.

FIG. 3 shows an example configuration (e.g., arrangement) of circuitry portions $303_0$, $303_1$, and $303_N$, memory cells 302A and 302B, access lines 340, 341, 342, and 343, and bit lines $325A_0$, $325A_1$, $325A_N$, $325B_0$, $325B_1$, and $325B_N$. However, memory device 200 can have another configuration known to those skilled in the art (e.g., any of open bit line, folded bit line, interleaved bit lines, and other configurations). Further, for simplicity, FIG. 3 omits other circuitry of memory device 200 that are also coupled to bit lines $325A_0$, $325A_1$, $325A_N$, $325B_0$, $325B_1$, and $325B_N$. Such other circuitry can include isolation circuitry (e.g., isolation transistors), I/O select circuitry (e.g., column select transistors), and other circuitry know to those skilled in the art.

As shown in FIG. 3, each of circuitry portions $303_0$, $303_1$, and $303_N$ can include an N-sense amplifier (NSA) 331, a P-sense amplifier (PSA) 332, and a precharge circuit 333. Precharge circuit 333 can include a node to a receive signal (e.g., control signal) PRECH_CTL. Voltage switch circuitry 314 can include nodes to receive signals (e.g., control signals) PRE_PRECH and SA_EN. As described in more detail below, signals PRE_PRECH and SA_EN can be activated at different times to cause signal $V_{NSA}$ to have different values at different times, and to cause signal $V_{PSA}$ to have different values at different times, depending on a particular phase of a memory operation that memory device 200 performs. Signal PRECH_CTL at a particular precharge circuit 333 can be activated during a phase of a memory operation to cause a respective bit line pair (e.g., $325A_0$/$325B_0$, $325A_1$/$325B_1$, or $325A_N$/$325B_N$) to be charged (e.g., precharged) to the same voltage (e.g., a voltage provided by signal $V_{NSA}$) during that phase of the memory operation.

As shown in FIG. 3, line 231 can be shared by N-sense amplifier 331 and precharge circuit 333 of each of circuitry portions $303_0$, $303_1$, and $303_N$. This means that N-sense amplifiers 331 and precharge circuits 333 of circuitry portions $303_0$, $303_1$, and $303_N$ and can be electrically coupled among each other (through line 231) at respective portions of N-sense amplifiers 331 and precharge circuits 333 of circuitry portions $303_0$, $303_1$, and $303_N$. Since line 231 can be used to provide the same voltage to N-sense amplifiers 331 of circuitry portions $303_0$, $303_1$, and $303_N$, line 231 can be called a "common source N" line.

Line 232 can be shared by P-sense amplifier 332 of each of circuitry portions $303_0$, $303_1$, and $303_N$. This means that P-sense amplifiers 332 of circuitry portions $303_0$, $303_1$, and $303_N$ can be electrically coupled among each other (through line 232) at respective portions of P-sense amplifiers 332 of circuitry portions $303_0$, $303_1$, and $303_N$. Since line 232 can be used to provide the same voltage to P-sense amplifiers 332 of circuitry portions $303_0$, $303_1$, and $303_N$, line 232 can be called a "common source P" line.

Figure 4:
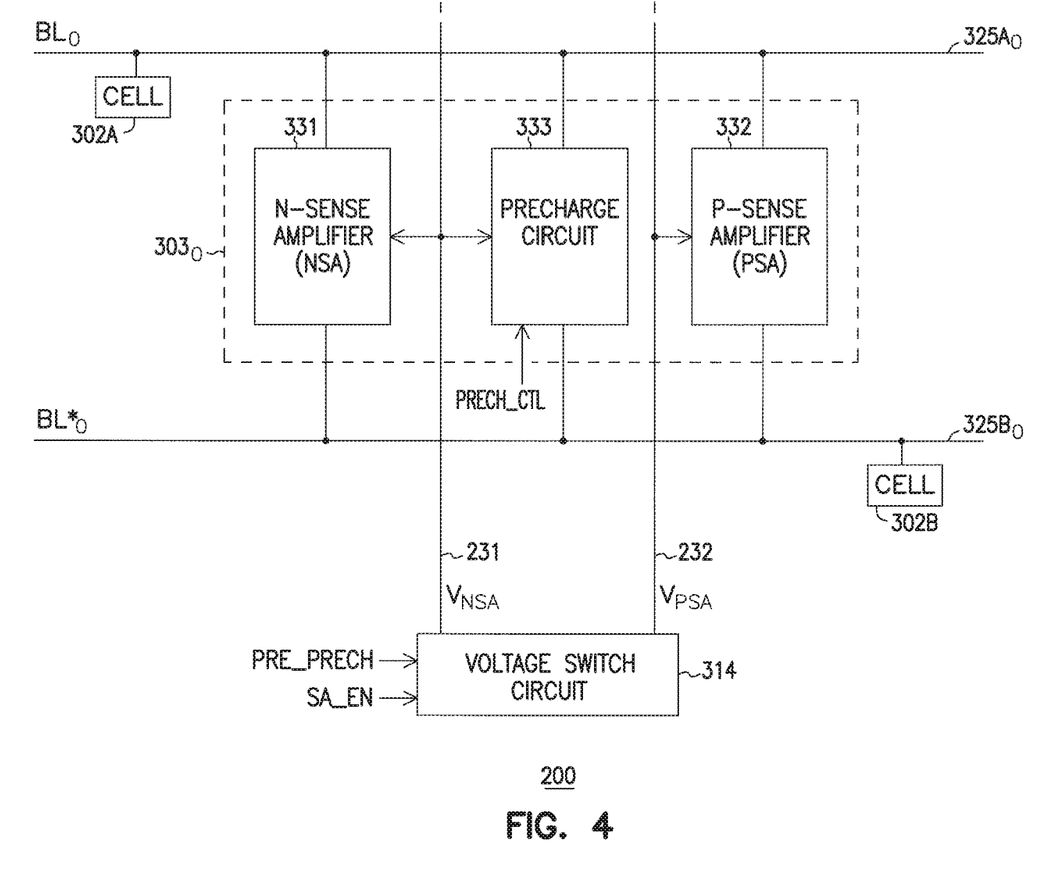
FIG. 4 shows a block diagram of one of the circuitry portions of the memory device of FIG. 3, according to some embodiments described herein.

FIG. 4 shows a block diagram of a portion of memory device 200 of FIG. 3 including circuitry portion $303_0$, bit lines $325A_0$ and $325B_0$, and memory cells 302A and 302B, according to some embodiments described herein. As shown in FIG. 4, voltage switch circuit 314 can receive signals PRE_PRECH and SA_EN. Precharge circuit 333 can receive signal PRECH_CTL. Voltage switch circuit 314 can provide signals $V_{NSA}$ and $V_{PSA}$ on lines 231 and 232, respectively. Lines 231 and 232 can be coupled to N-sense amplifier 331 and P-sense amplifier 332, respectively. Line 231 can also be coupled to precharge circuit 333.

Figure 5:
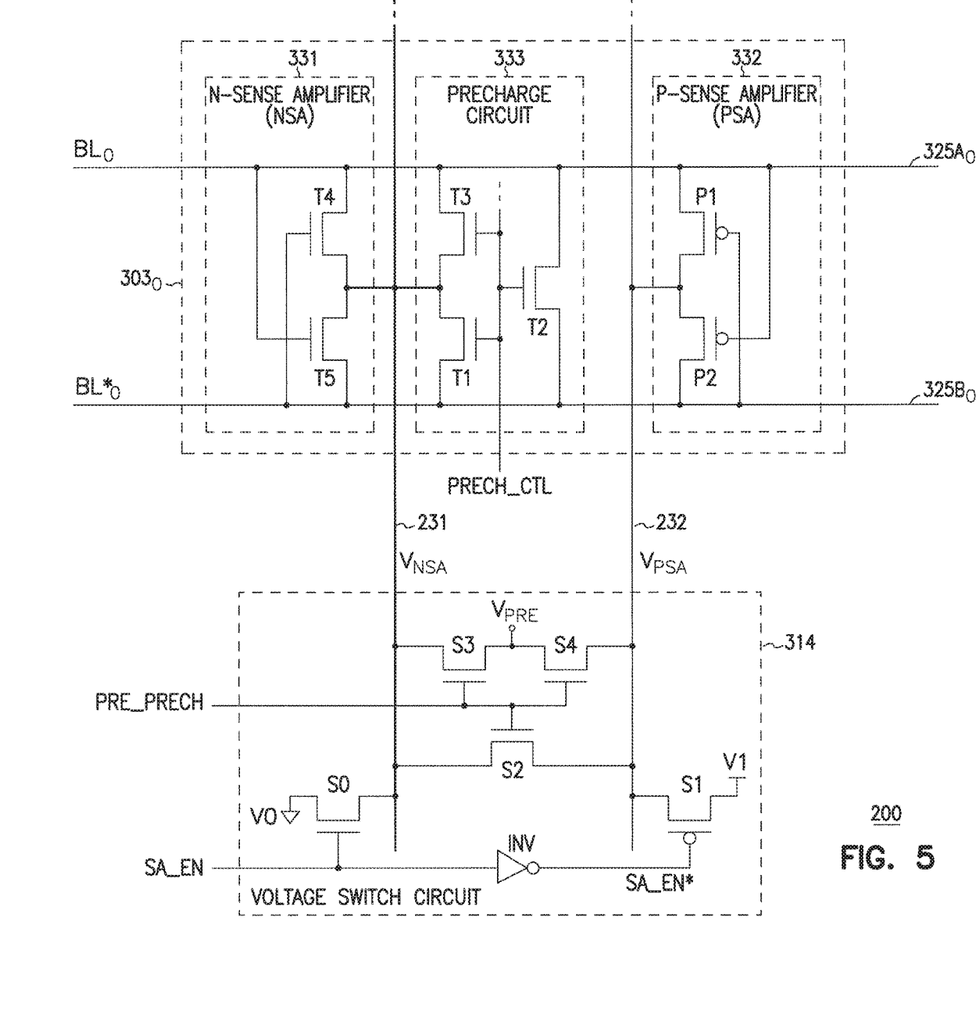
FIG. 5 shows a schematic diagram of the portion of the memory device of FIG. 4, according to some embodiments described herein.

FIG. 5 shows a schematic diagram of the portion of memory device 200 of FIG. 4, according to some embodiments described herein. As shown in FIG. 5, precharge circuit 333 can include transistors T1, T2, and T3. N-sense amplifier 331 can include transistors T4 and T5. P-sense amplifier 332 can include transistors P1 and P2. Voltage switch circuit 314 can include transistors S0, S1, S2, S3, and S4, and an inverter INV. Each of transistors T1, T2, T3, S0, S1, S2, S3, and S4 can include a field effect transistor (FET), such as an n-channel metal-oxide semiconductor (NMOS) transistor. Each of transistors P1 and P2 can include a FET, such as a p-channel metal-oxide semiconductor (PMOS) transistor.

Memory device 200 may have improvements over some conventional memory devices. For example, some conventional memory devices may have a configuration that uses one conductive line to provide a voltage (having one value) for a sense amplifier (e.g., N-sense amplifier), and another conductive line to provide another voltage (having another value) for a balance circuit (e.g., a precharge/equalization circuit) that is used to precharge two bit lines to the same voltage. Thus, in such a conventional configuration, two separate conductive lines are used for the conventional sense amplifier and the balance circuit. In memory device 200, as shown in FIG. 5, memory device 200 uses the same conductive line (e.g., only one conductive line) 231 to provide different voltages to N-sense amplifier 331 and precharge circuit 333 at different times. This allows memory device 200 to have a smaller size (e.g., smaller circuit layout) and fewer conductive lines for sensing circuitry in comparison with some conventional memory devices.

FIG. 5 shows an example where memory device 200 includes two different signals (PRE_PRECH and PRECH_CTL) to control (e.g., turn on or turn off) transistors S2, S3, S4, T1, T2, and T3. However, in an alternative configuration, memory device 200 can use the same signal (a single signal) to control transistors S2, S3, S4, T1, T2, and T3. As an example, in an alternative configuration, either one of signals PRE_PRECH and PRECH_CTL can be eliminated, and the remaining signal can be used to control transistors S2, S3, S4, T1, T2, and T3. Further, FIG. 5 shows an example where precharge circuit 333 includes NMOS transistors. Alternatively, precharge circuit 333 can include PMOS transistors. Precharge circuit 333 having PMOS transistors may have a larger size than precharge circuit 333 having NMOS transistors.

In FIG. 5, voltage V0 can have a value of ground potential (e.g., ground connection (e.g., Vss) of memory device 200). Voltage V1 can have a value based on a supply voltage (e.g., Vcc or VOD specially generated for a sense amplifier) of memory device 200. Voltage $V_{PRE}$ can have a value based on voltage V1 (e.g., $V_{PRE}=\frac{1}{2}$ V1).

During a time interval (e.g., a precharge phase) of a memory operation (e.g., a read operation) of memory device 200, line 231 can have a voltage of $V_{PRE}$ (e.g., $V_{NSA}=V_{PRE}$) when transistor S0 is turned off (based on the level of signal SA_EN) and transistors S2, S3, and S4 are turned on (based on the level of signal PRE_PRECH). During another time interval (e.g., sense and amplification phase) of a memory operation (e.g., a read operation) of memory device 200, line 231 can have a voltage of V0 (e.g., $V_{NSA}=V0$) when transistor S1 is turned on, and transistors S2, S3, and S4 are turned off.

Figure 6:
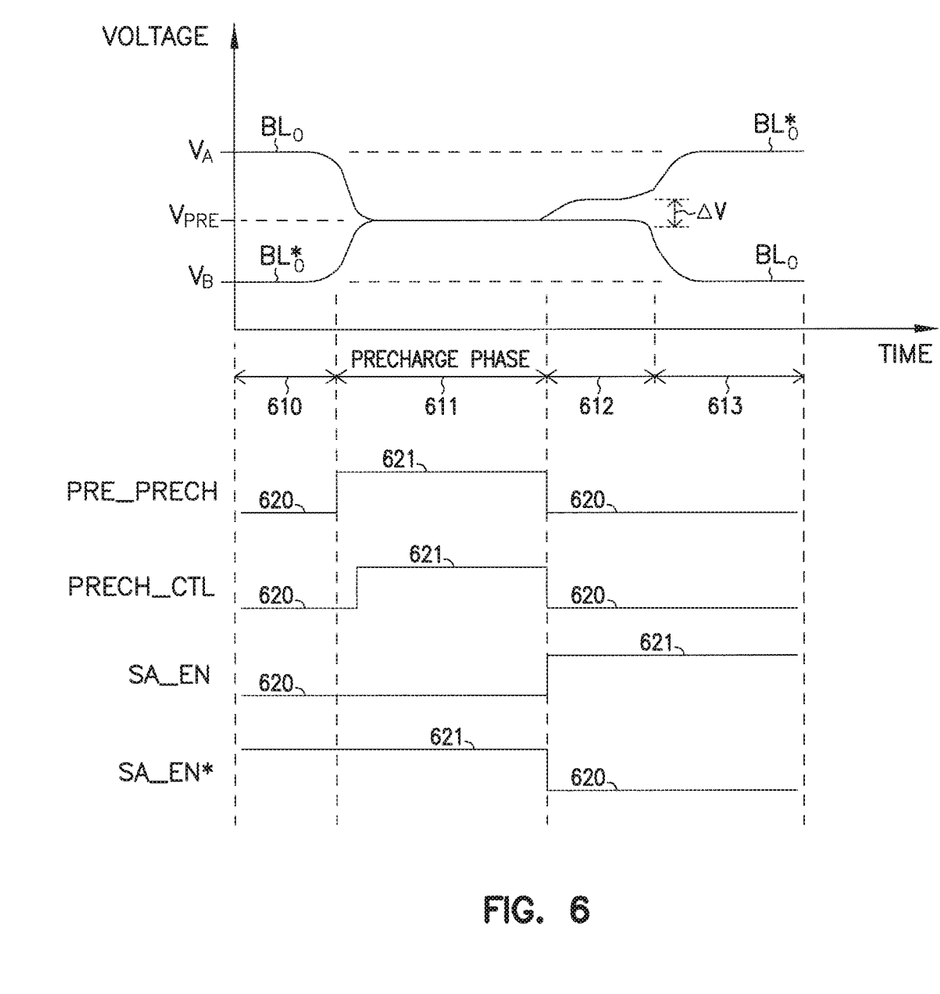
FIG. 6 shows an example timing diagram including waveforms of signals of some data lines during different phases of an example memory operation of the portion of the memory device of FIG. 4, according to some embodiments described herein.

FIG. 6 shows an example timing diagram including waveforms of signals $BL_0$ and $BL_0^*$ during different phases of an example memory operation of memory device 200 of FIG. 5, according to some embodiments described herein. As shown in FIG. 6, the timing diagram can include time intervals 610, 611, 612 and 613. A memory operation (e.g., a read operation) of memory device 200 can include a precharge phase that can occur during time interval 611 and a sense and amplification phase that can occur during at least a portion of time interval 612 and during time interval 613.

Signals PRE_PRECH, PRECH_CTL, SA_EN (e.g., sense amplifier enable signal), and SA_EN* can be activated (and deactivated) based on levels 620 and 621 (voltage levels) applied to these signals during time intervals 610, 611, 612, and 613 as shown in FIG. 6. Level 620 (e.g., "LOW") and level 621 (e.g., "HIGH") can cause an NMOS transistor (e.g., T1, T2, T3, S2, S3, and S4) to turn off and turn on, respectively. Level 620 and level 621 can cause a PMOS transistor (e.g., P1 and P2) to turn on and turn off, respectively. The following description refers to FIG. 5 and FIG. 6.

During time interval 610 (FIG. 6), signals $BL_0$ and $BL_0^*$ can have values $V_A$ and $V_B$, respectively, which correspond to the values of voltages on respective bit lines $325A_0$ and $325B_0$ of FIG. 5. In the example read operation associated with FIG. 6, either memory cell 302A or 302B can be a selected memory cell in order to read information (e.g., previously stored information) from the selected memory cell. Time interval 610 can occur before memory cell 302A or 302B is accessed.

During time interval 611 (e.g., a precharge phase) of the memory operation, precharge circuit 333 can be activated (e.g., transistors T1, T2, and T3 are turned on) and N-sense amplifier 331 and P-sense amplifier 332 can be deactivated (transistors T4, T5, P1 and P2 are turned off). Precharge circuit 333 can operate to precharge (e.g., equilibrate) bit lines $325A_0$ and $325B_0$, such that the voltages on bit lines $325A_0$ and $325B_0$ can have the same value (or substantially the same value). FIG. 6 shows signals $BL_0$ and $BL_0^*$ converging to the same (or substantially the same) voltage value (such as value $V_{PRE}$) during time interval 611, indicating that the voltages on bit lines $325A_0$ and $325B_0$ have the same value of value of $V_{PRE}$ during time interval 611.

During time interval 611, transistors S2, S3, and S4 can be turned on, and transistors S0 and S1 can be turned off. Thus, line 231 can be provided with voltage $V_{PRE}$ (e.g., $V_{NSA}=V_{PRE}$) through transistors S2, S3, and S4. Transistors T1, T2, and T3 can be turned on. This causes bit lines $325A_0$ and $325B_0$ to couple to each other through the turned on transistors T1, T2, and T3. Thus, during time interval 611, bit lines $325A_0$ and $325B_0$ can have the same voltage (e.g., $V_{NSA}=V_{PRE}$) from line 231.

During time interval 612, information can be transferred from the selected memory cell (one of memory cells 302A and 302B) to the bit line (one of bit lines $325A_0$ and $325B_0$) coupled to the selected memory cell. FIG. 6 shows a voltage difference ΔV (a delta V) between signals $BL_0$ and $BL_0^*$ during time interval 612 to indicate a difference in values between the voltages on bit lines $325A_0$ and $325B_0$ when the selected memory cell is accessed and information is transferred to one of bit lines $325A_0$ and $325B_0$ from the accessed memory cell.

During time interval 613, precharge circuit 333 can be deactivated (e.g., transistors T1, T2, and T3 are turned off) and N-sense amplifier 331 and P-sense amplifier 332 can be activated (e.g., transistors S0 and S1 are turned on). N-sense amplifier 331 and P-sense amplifier 332 (FIG. 5) can operate to sense signals $BL_0$ and $BL_0^*$ and amplify voltage difference ΔV to determine the value of information read from the selected memory cell. For example, N-sense amplifier 331 can operate such that one of transistors T4 and T5 is turned on and the other one is turned off. P-sense amplifier 332 can operate such that one of transistors P1 and P2 is turned on and one the other one is turned off. The operations of N-sense amplifier 331 and a P-sense amplifier 332 can cause signals $BL_0$ and $BL_0^*$ to go to opposite directions during time interval 613. For example, if the value of the voltage on bit line $325B_0$ (signal $BL_0^*$) is greater than the value of the voltage on bit line $325A_0$ (as shown in FIG. 6 during time interval 612 the level of signal $BL_0^*$ is higher than the level of signal $BL_0$), then signal $BL_0^*$ goes to a level corresponding to value $V_A$ and signal $BL_0$ goes to a level corresponding to value $V_B$. In the opposite situation (not shown in FIG. 6) if the value of the voltage on bit line $325B_0$ (signal $BL_0^*$) is less than the value of the voltage on bit line $325A_0$, then signal $BL_0^*$ goes to a level corresponding to value $V_B$ and signal $BL_0$ goes to a level corresponding to value $V_A$.

In FIG. 6, the voltage values of signals $BL_0$ and $BL_0^*$ during time interval 612 are based on the value of information stored in the selected memory cell (one of memory cells 302A and 302B). For example, if the selected memory cell is memory cell 302A and it stores information with a value that is less than value $V_{PRE}$ (e.g., logic 0), then the value of signal $BL_0$ during time interval 612 is less than the value of signal $BL_0^*$, as shown in FIG. 6 in this example. If memory cell 302A stores information with a value that is higher than $V_{PRE}$ (e.g., logic 1), then the value of signal $BL_0$ during time interval 612 would be greater than the value of signal $BL_0^*$ (not shown in FIG. 6).

In the example read operation described above, additional circuitry (not shown, but can be similar to select circuitry 115 and I/O circuitry 116 of FIG. 1) of memory device 200 can provide output information (e.g., logic 1 or 0) based on the voltage values of signals $BL_0$ and $BL_0^*$ during time interval 613. The output information can be transferred to lines 112 and subsequently to other devices coupled to memory device 200.

The above description describes an example read operation where N-sense amplifier 331 and P-sense amplifier 332 can operate to determine the value of information read from a selected memory. In a write operation of memory device 200, the additional circuitry (not shown) of memory device 200 can provide values (e.g., voltages representing logic 1 or 0) to bit lines $325A_0$ or $325B_0$, so that the value can be stored in the selected memory cell coupled to bit line $325A_0$ or $325B_0$.

FIG. 5 and FIG. 6 show components (e.g., transistors) and operation for N-sense amplifier 331, P-sense amplifier 332, and precharge circuit 333 of circuitry portion $303_0$ of memory device 200. Other circuitry portions (e.g., $303_1$ and $303_N$) of memory device 200 (FIG. 3) can have similar components and operations.

Figure 7:
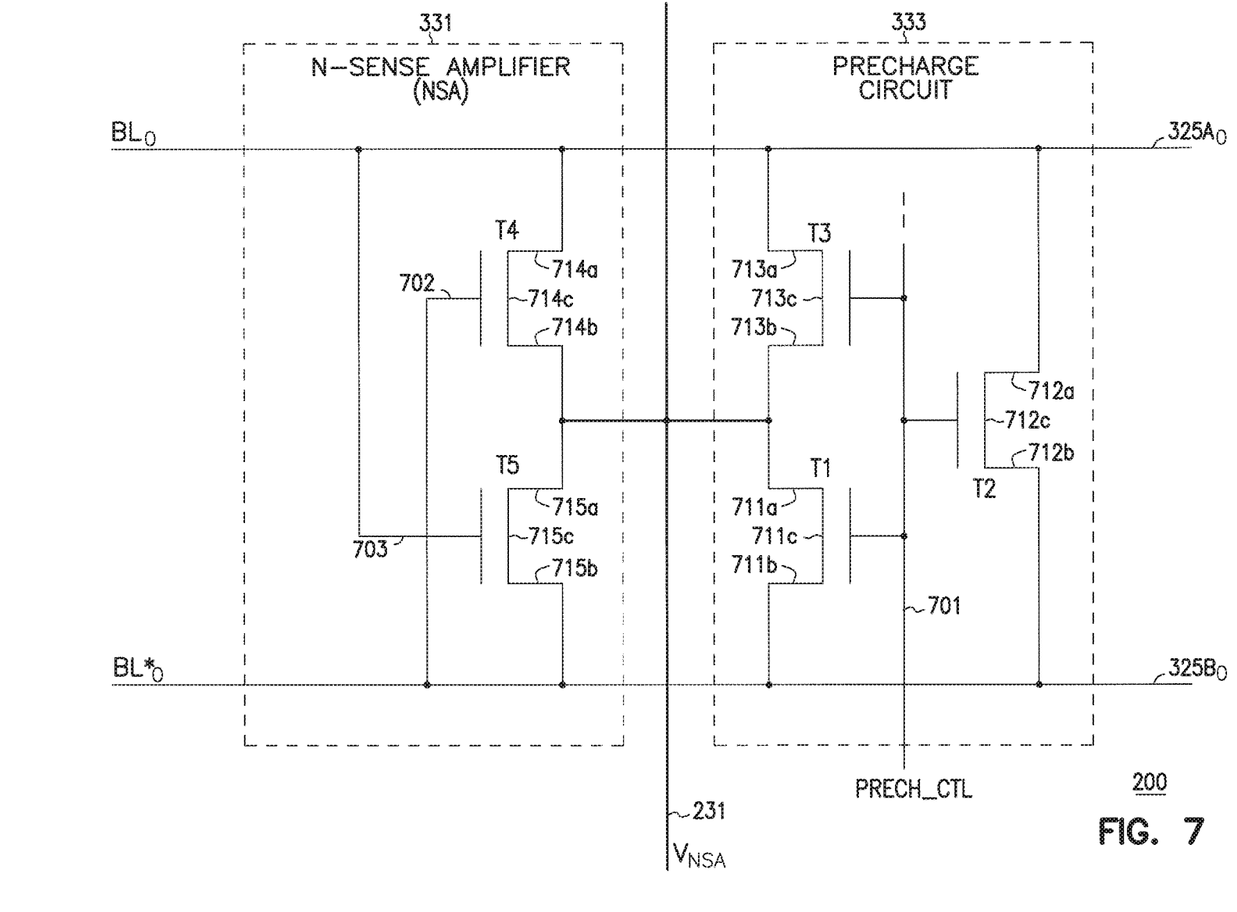
FIG. 7 shows a schematic diagram of a portion of the memory device of FIG. 5 including details of transistors of a precharge circuit and an N-sense amplifier, according to some embodiments described herein.

FIG. 7 shows a schematic diagram of a portion of memory device 200 including details of transistors T1, T2, and T3 of precharge circuit 333 and details of transistors T4 and T5 of N-sense amplifier 331, according to some embodiments described herein. Each of transistors T1, T2, T3, T4, and T5 can include a gate, a drain, a source, and a channel (e.g., transistor body) between the source and the drain. For example, transistor T1 includes a drain, a source, and a channel 711a, 711b, and 711c, respectively. Transistor T2 includes a drain, a source, and a channel 712a, 712b, and 712c, respectively. Transistor T3 includes a drain, a source, and a channel 713a, 713b, and 713c, respectively. In this description, the terms "source" and "drain" of a transistor are used interchangeably. As shown in FIG. 7, memory device 200 can include a single gate 701 (that receives signal PRECH_CTL) that is shared by transistors T1, T2, and T3 of precharge circuit 333.

Transistor T4 of N-sense amplifier 331 includes a gate, a drain, a source, and a channel 702, 714a, 714b, and 714c, respectively. Transistor T5 includes a gate, and a drain, a source, and a channel 703, 715a, 715b, and 715c, respectively.

The sources and drains of transistors T1, T2, T3, T4, and T5 can be formed by diffusion regions of substrate 206 of memory device 200 (e.g., at locations 203 of memory device 200 in FIG. 2). The channels (e.g., channels 711c, 712c, 713c, 714c, and 715c) of transistors T1, T2, T3, T4, and T5 can be formed by channel regions located between respective sources and drains of transistors T1, T2, T3, T4, and T5. The gates (e.g., 701, 702, and 703) of transistors T1, T2, T3, T4, and T5 can be formed by respective conductive lines that are located over diffusion regions 801 through 811 (FIG. 8) and channels 711c, 712c, 713c, 714c, and 715c.

Figure 8:
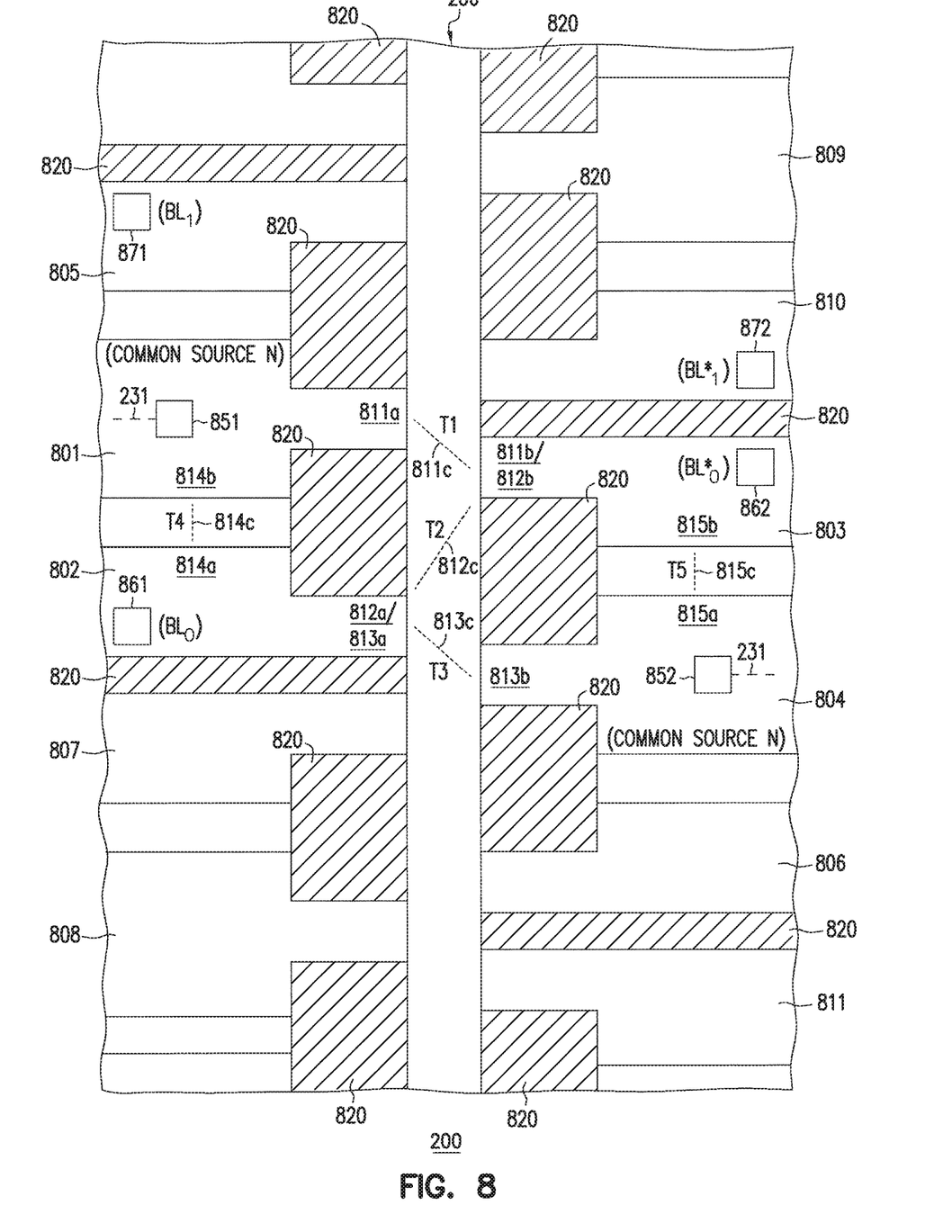
FIG. 8 shows a layout including diffusions regions and channel regions of the transistors of the precharge circuit and the N-sense amplifier of FIG. 7, according to some embodiments described herein.

FIG. 8 shows a layout of a portion of a memory device 200 including diffusion regions and channel regions of transistors T1, T2, T3, T4, and T5 of FIG. 7, according to some embodiments described herein. As shown in FIG. 8, memory device 200 can include diffusion regions 801 through 811, channel regions 811c, 812c, 813c, 814c, and 815c, and isolation structures 820.

Isolation structures 820 are electrically non-conductive structures. Thus, the material of isolation structures 820 includes electrically non-conductive material (e.g., silicon dioxide or other dielectric materials). Examples of isolation structures 820 include shallow trench isolation (STI) structures.

Each of diffusion regions 801 through 811 can include material of one conductivity type (e.g., n-type), and each of channel regions 811c, 812c, 813c, 814c, and 815c can include a material of another conductivity type (e.g., p-type), which can be the same as the conductivity type of substrate 206. As an example, diffusion regions 801 through 811 can include portions of substrate 206 (e.g., a p-type substrate) that are doped with n-type impurities (e.g., arsenic or phosphorous), and channel regions 811c, 812c, 813c, 814c, and 815c can be portions of substrate 206 (between respective diffusion regions 801 through 811) that are not doped with n-type impurities.

Some of diffusion regions 801 through 811 can be shared by transistors T1, T2, T3, T4, and T5 and can be used as respective sources and drains of transistors T1, T2, T3, T4 and T5. For example, diffusion region 801 can be shared by transistors T1 and T4 and can be used as source and drain of transistors T1 and T4. Diffusion region 802 can be shared by transistors T2, T3, and T4 and can be used as source and drain of transistors T2 and T3. Diffusion region 803 can be shared by transistors T1, T2, and T5 and can be used as source and drain of transistors T1, T2, and T5. Diffusion region 804 can be shared by transistors T3 and T5 and can be used as source and drain of transistors T3 and T5. Sharing diffusion regions between transistors T1, T2 and T3 (transistors of precharge circuit 333), and transistors T4 and T5 (transistors of N-sense amplifier 331) may allow memory device 200 to have a smaller area for sensing circuitry of memory device 200 in comparison with some conventional memory devices.

As shown in FIG. 8, each of diffusion regions 801, 802, 803, and 804 can include an elongated portion. For example, diffusion region 801 can include portion 811a, which is an elongated portion of diffusion region 801. Diffusion region 802 can include portion 812a/813a, which is an elongated portion of diffusion region 802. Diffusion region 803 can include portion 811b/812b, which is an elongated portion of diffusion region 803. Diffusion region 804 includes portion 813b, which is an elongated portion of diffusion region 804.

Channel regions 811c, 812c, 813c, 814c, and 815c can form channels of transistors T1, T2, T3, T4, and T5, respectively. As shown in FIG. 8, channel region 811c can be located between portion 811a and portion 811b/812b. Channel region 812c can be located between portion 811b/812b and portion 812a/813a. Channel region 813c can be located between portion 812a/813a and portion 813b. Channel region 814c can be located between a portion 814a of diffusion region 802 and a portion 814b of diffusion region 801. Channel region 815c can be located between a portion 815a of diffusion region 804 and a portion 815b of diffusion region 803.

In FIG. 8, portion 811a, portion 811b/812b, and channel region 811c can form drain, source, and channel 711a, 711b, and 711c (FIG. 7), respectively, of transistor T1. Portion 812a/813a, portion 811b/812b, and channel region 812c can form drain, source, and channel 712a, 712b, and 712c (FIG. 7), respectively, of transistor T2. Portion 812a/813a, portion 813b, and channel region 813c can form drain, source, and channel 713a, 713b, and 713c (FIG. 7), respectively, of transistor T3. Portion 814a, portion 814b, and channel region 814c can form drain, source, and channel 714a, 714b, and 714c, respectively (FIG. 7), of transistor T4. Portion 815a, portion 815b, and channel region 815c can form drain, source, and channel 715a, 715b, and 715c (FIG. 7), respectively, of transistor T5.

FIG. 8 shows a specific portion of each of diffusion regions 801, 802, 803, and 804 as corresponding to the source (or drain) of a particular transistor among transistors T1, T2, T3, T4, and T5 in order to help match the source and drain of each of transistors T1, T2, T3, T4, and T5 of FIG. 7 with diffusion regions 801, 802, 803, and 804 of FIG. 8. However, the entire diffusion region (among diffusion regions 801, 802, 803, and 804) can be the source (or drain) of a particular transistor among transistor T1, T2, T3, T4, or T5. For example, the entire diffusion region 801 can be the source of transistor T1, and the entire diffusion region 803 can be the drain of transistor T1. Similarly, the entire diffusion region 803 (which is shared by transistors T1 and T2) can be the source of transistor T2, and the entire diffusion region 802 can be the drain of transistor T2.

FIG. 8 shows the label "common source N" at diffusion regions 801 and 804 to indicate that both diffusion regions 801 and 804 can be coupled to line 231 (e.g., common source N line). For example, memory device 200 can include conductive contacts (e.g., contact plugs) 851 and 852 electrically coupled to (e.g., directly contacting) diffusion regions 801 and 804, respectively. As mentioned above, line 231 can be structured as a conductive line. In FIG. 8, line 231 can be formed over (formed on a wiring layer over diffusion regions 801 through 811) and can be electrically coupled to diffusion regions 801 and 804 through conductive contacts 851 and 852, respectively. Thus, diffusion regions 801 and 804 can be electrically coupled to each other through conductive contacts 851 and 852 and line 231.

FIG. 8 also shows labels for signals $BL_0$, $BL_0^*$, $BL_1$, and $BL_1$ at diffusion regions 802, 803, 805, and 810, respectively, to indicate that bit lines $325A_0$, $325B_0$, $325A_1$, $325B_1$ of FIG. 3 (and associated signals $BL_0$, $BL_0^*$, $BL_1$, and $BL_1$) can be coupled to diffusion regions 802, 803, 805, and 810, respectively. For example, memory device 200 can include conductive contacts (e.g., contact plugs) 861 and 862 electrically coupled to (e.g., directly contacting) diffusion regions 802 and 803, respectively. Bit lines $325A_0$ and $325B_0$ (not shown in FIG. 8) can be formed over (formed on a wiring layer over diffusion regions 801 through 811) and can be electrically coupled to diffusion regions 802 and 803 through conductive contacts 861 and 862, respectively. Similarly, memory device 200 can include conductive contacts (e.g., contact plugs) 871 and 872 electrically coupled to (e.g., directly contacting) diffusion regions 805 and 810, respectively. Bit lines $325A_1$ and $325B_1$ (not shown in FIG. 8) can be formed over (formed on a wiring layer over diffusion regions 801 through 811) and can be electrically coupled to diffusion regions 805 and 810 through conductive contacts 871 and 872, respectively.

The description above with reference to FIG. 8 describes a layout of transistors T1, T2 and T3 of precharge circuit 333 and transistors T4 and T5 of N-sense amplifier 331 of circuitry portion $303_0$ (FIG. 3). However, N-sense amplifier 331 and precharge circuit 333 of each of other circuitry portions (e.g., $303_1$ and $303_N$ of FIG. 3) of memory device 200 can have transistors and layout similar to those of transistors T1, T2, T3, T4, and T5 and layout shown in FIG. 8.

Sharing diffusion regions between N-sense amplifier 331 and precharge circuit 333, as shown in FIG. 8, may allow the size of sensing circuitry of memory device 200 to be smaller than the size sensing circuitry of some conventional memory devices. Further, the layout of sensing circuitry (e.g., in FIG. 8) of memory device 200 may allow memory device 200 to have fewer conductive contacts (e.g., similar conductive contacts 861, 862, 871, and 872) and associated wiring connections. For example, in comparison with some conventional memory devices, because of shared diffusion regions between N-sense amplifier 331 and precharge circuit 333, some conductive contacts may be eliminated. This may further reduce the size of sensing circuitry of memory device 200.

Figure 9:
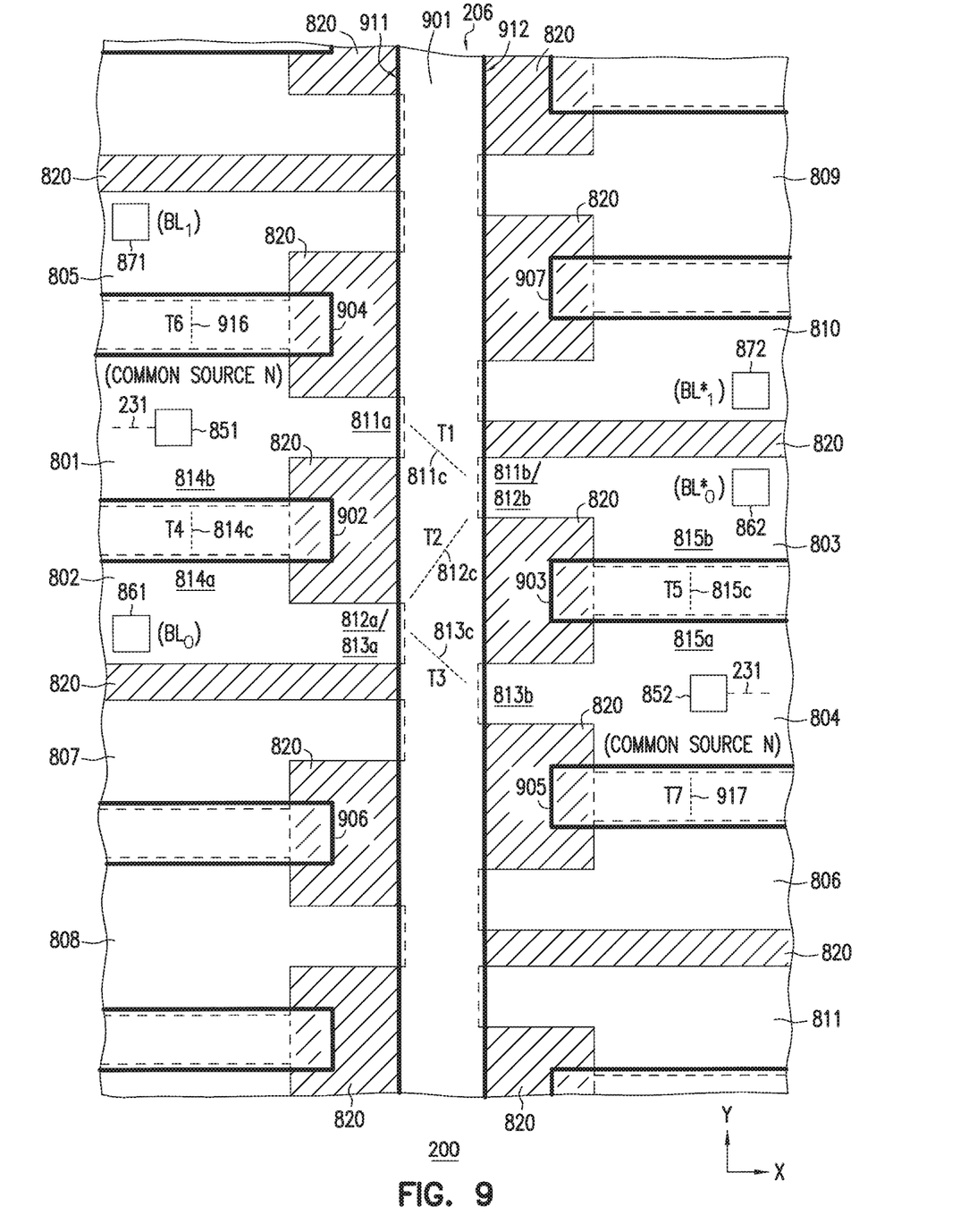
FIG. 9 shows the layout of the memory device of FIG. 8 including gates of the transistors, according to some embodiments described herein.

FIG. 9 shows a layout of a portion of a memory device 200 of FIG. 8 including gates 901, 902, 903, 904, and 905 located over (e.g., disposed over, such as covering) respective channel regions of memory device 200 of FIG. 8, according to some embodiments described herein. Gates 901, 902, and 903 of FIG. 9 can correspond to gate 701, 702, and 703, respectively, of FIG. 7.

As shown in FIG. 9, gate 901 can have a side (e.g., edge) 911, and a side (e.g., edge) 912 opposite from side 911. Diffusion regions 801 and 802 can be located on side 911. Diffusion regions 803 and 804 can be located side 912. Gate 901 can have a length in the y-direction (which is perpendicular to an x-direction). Gate 901 can extend linearly (or generally linearly) between diffusion regions 801 and 802 on side 911 and between diffusion regions 803 and 804 on side 912. Gate 901 can be located over channel regions 811c, 812c, and 813c, such that gate 901 can include a portion located directly over channel region 811c, a portion located directly over channel region 812c, and a portion located directly over channel region 813c. Thus, as shown in FIG. 9, memory device 200 can include a single gate (e.g., 901) for transistors T1, T2, and T3 of precharge circuit 333 (FIG. 7).

As shown in FIG. 9, each of gates 902 and 903 can have a length extending in the x-direction. Gate 902 can be located over channel region 814c, such that gate 902 can include a portion located directly over channel region 814c. Gate 903 can be located over channel region 815c, such that gate 903 can include a portion located directly over channel region 815c.

As shown in FIG. 7, gate 702 can be coupled to bit line $325B_0$ and source 715b of transistor T5. In FIG. 9, gate 902 corresponds to gate 702, and diffusion region 803 can form source 715b of transistor T5. Thus, in FIG. 9, diffusion region 803 and gate 902 can be electrically coupled to each other (through conductive contacts and wirings, not shown in FIG. 9).

Similarly, as shown in FIG. 7, gate 703 can be coupled to bit line $325A_0$ and drain 714a of transistor T4. In FIG. 9, gate 903 correspond to gate 703, and diffusion region 802 can form drain 714a of transistor T4. Thus, in FIG. 9, diffusion region 802 and gate 903 can be electrically coupled to each other (through conductive contacts and wirings, not shown in FIG. 9).

FIG. 9 also shows gates 904 and 905 located over channel regions 916 and 917, respectively. Gate 904 and channel region 916 can form part of (e.g., a gate and a channel) of a transistor T6 in which diffusion regions 801 and 805 can form a source and a drain, respectively, of transistor T6. Gate 905 and channel region 917 can form part of (e.g., a gate and a channel) of a transistor T7 in which diffusion regions 804 and 806 can form a source and a drain, respectively, of transistor T7. FIG. 9 further shows gates 906 and 907 of other transistors (not labeled in FIG. 9) of memory device 200. Transistors T6 and T7 and gates 906 and 907 can be part of other circuitry portions of memory device 200. For example, transistor T6 can be part of circuitry portion $303_1$ of FIG. 3.

FIG. 9 shows overlaps (viewed from a top view (e.g., layout) of memory device 200) between each of gates 901, 902, 903, 904, 905, 906, and 907 and respective diffusion regions 801 through 811 as an example. However, there may be fewer or no overlaps between gate 901 and diffusion regions 801 through 811. Similarly, there may be fewer or no overlaps between gates 902, 903, 904, 905, 906, and 907 and respective diffusion regions 801 through 811.

Figure 10:
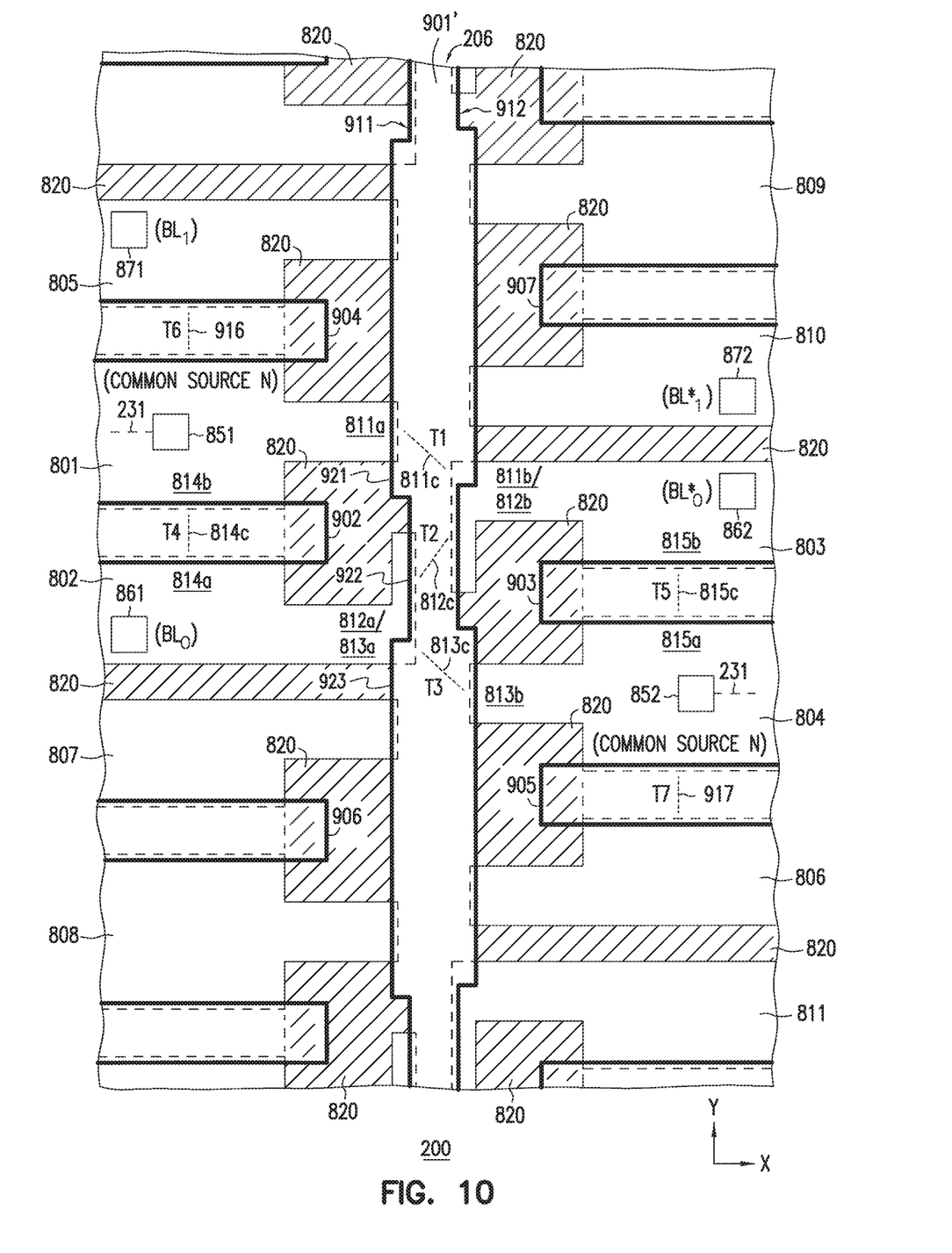
FIG. 10 shows a layout including a variation of one of the gates of the transistors of the precharge circuit of the memory device of FIG. 9, according to some embodiments described herein.

FIG. 10 shows a layout of a portion of a memory device 200 of FIG. 8 including a gate 901', which can be a variation of gate 901 of FIG. 9, according to some embodiments described herein. As shown in FIG. 9, gate 901' can have a length in the x-direction (which is perpendicular to a y-direction). Gate 901' can include a portion 921 located (e.g., directly located) over (e.g., located directly over) channel region 811c, a portion 922 located (e.g., directly located) over channel region 812c, and a portion 923 located (e.g., directly located) over channel region 813c. As shown in FIG. 10, portion 922 can be narrower than each of portions 921 and 923 with respect to the x-direction. Unlike portions 812a/813a and 811b/812b (elongated portions of diffusion regions 802 and 803, respectively) of FIG. 9, each of portions 812a/813a and 811b/812b in FIG. 10 can have a shape different from the shape shown in FIG. 9.

The illustrations of apparatuses (e.g., memory devices 100 and 200) and methods (e.g., operating methods associated with memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., a computer, a cellular phone, or other electronic system) that includes a device such as any of memory devices 100 and 200.

Any of the components described above with reference to FIG. 1 through FIG. 10 can be implemented in a number of ways, including simulation via software. Thus, apparatuses (e.g., memory devices 100 and 200 or part of each of these memory devices, including a control unit in these memory devices, such as control unit 118 (FIG. 1)) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100 and 200 and may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10 include apparatus and methods using a first diffusion region, a second diffusion region, a third diffusion region, and a fourth diffusion region; a first channel region located between a portion of the first diffusion region and a portion of the third diffusion region; a second channel region located between the portion of the third diffusion region and a portion of the second diffusion region; a third channel region located between the portion of the second diffusion region and a portion of the fourth diffusion region; and a gate located over the first, second, and third channel regions. The first and second diffusion regions are located on a first side of the gate. The third and fourth diffusion regions are located on a second side of the gate opposite from the first side. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a first gate including first, second and third portions, the first, second and third portions located over first, second and third channel regions, respectively;
   second and third gates disposed such that the first gate is arranged between the second and third gates, the second and third gates located over fourth and fifth channel regions, respectively;
   first and second diffusion regions formed to define the fourth channel region; and
   third and fourth diffusion regions formed to define the fifth channel region, wherein each of the first, second, third and fourth diffusion regions includes a respective elongated portion to define the first channel region between the elongated portion of the first diffusion region and the elongated portion of the third diffusion region, the second channel region between the elongated portion of the second diffusion region and the elongated portion of the third diffusion region, and the third channel region between the elongated portion of the second diffusion region and the elongated portion of the fourth diffusion region.

2. The apparatus of claim 1, further comprising:
   fourth and fifth gates disposed such that the first gate is arranged between the fourth and fifth gates, the fourth and fifth gates located over sixth and seventh channel regions, respectively;
   a fifth diffusion region formed to define the sixth channel region with the first diffusion region; and
   a sixth diffusion region formed to define the seventh channel region with the fourth diffusion region.

3. The apparatus of claim 1, further comprising a fifth diffusion region and a fourth gate disposed over a portion of the fifth diffusion region and a portion of the first diffusion region.

4. The apparatus of claim 3, further comprising a sixth diffusion region and a fifth gate disposed over a portion of the sixth diffusion region and a portion of the fourth diffusion region.

5. The apparatus of claim 4, wherein the first gate is arranged between the fourth and fifth gates.

6. The apparatus of claim 1, wherein the first diffusion region and the fourth diffusion region are electrically coupled to each other, the second diffusion region and the third gate are electrically coupled to each other, and the third diffusion region and the second gate are electrically coupled to each other.

7. The apparatus of claim 1, wherein the second portion of the first gate is narrower than each of the first portion and the third portion of the first gate.

8. The apparatus of claim 1, wherein each of the second and third gates includes a length extending in a direction perpendicularly to a direction of a length of the first gate.

9. The apparatus of claim 1, wherein the second gate is located on a first side of the first gate, and the third gate is located on a second side opposite from the first side of the first gate.

10. The apparatus of claim 1, wherein the first gate extends generally linearly between the first and second diffusion regions on a first side of the first gate and between the third and fourth diffusion regions on a second side of the first gate.

11. The apparatus of claim 1, wherein each of the first, second, third, and fourth diffusion regions includes a material of a first conductivity type, and each of the first, second, and third channel regions includes a material of a second conductivity type.

12. The apparatus of claim 1, wherein the apparatus comprises a memory device, the memory device comprising:
 a first memory cell array located at a first location of the memory device; and
 a second memory cell array located at a second location of the memory device, wherein the first, second, third, and fourth diffusions are located at a third location of the memory device between the first and second locations.

13. The apparatus of claim 1, wherein the apparatus comprises a memory device, and the first, second, third, and fourth diffusion regions are part of sensing circuitry of the memory device.

14. The apparatus of claim 1, further comprising:
 a first conductive contact coupled to the second diffusion region;
 a first data line coupled to the second conductive contact;
 a second conductive contact coupled to the third diffusion region; and
 a second data line coupled to the third conductive contact.

15. The apparatus of claim 1, further comprising:
 a first conductive contact coupled to the first diffusion region; and
 a second conductive contact coupled to the fourth diffusion region, wherein the conductive line is electrically coupled to the first and fourth diffusion regions through the first and second conductive contacts, respectively.

16. The apparatus of claim 1, wherein the apparatus comprises a memory device, the memory device comprising a memory cell array and access lines located at a first location of the memory device, wherein the conductive line is located at a second location of the memory device, and each of the access lines and the conductive line has a length extending in a same direction.

17. An apparatus comprising:
 a first diffusion region, a second diffusion region, a third diffusion region, and a fourth diffusion region;
 a first channel region located between a portion of the first diffusion region and a portion of the third diffusion region, wherein the first channel region, the portion of the first diffusion region, and the portion of the third diffusion region form part of a first transistor;
 a second channel region located between the portion of the third diffusion region and a portion of the second diffusion region, wherein the second channel region, the portion of the third diffusion region, and the portion of the second diffusion region form part of a second transistor;
 a third channel region located between the portion of the second diffusion region and a portion of the fourth diffusion region, wherein the third channel region, the portion of the second diffusion region, and the portion of the fourth diffusion region form part of a third transistor; and
 a first gate located over the first, second, and third channel regions;
 a second gate disposed over a portion of the first diffusion region and a portion of the second diffusion region; and
 a third gate disposed over a portion of the third diffusion region and a portion of the fourth diffusion region.

18. The apparatus of claim 17, wherein:
 the first and fourth diffusion regions are electrically coupled to each other;
 the second diffusion region and the third gate are electrically coupled to each other; and
 the third diffusion region and the second gate are electrically coupled to each other.

19. The apparatus of claim 17, wherein the first gate includes a first portion, a second portion, and a third portion, the second portion is between first and third portions, and the second portion is narrower than each of the first and third portions.

20. An apparatus comprising:
 a first diffusion region including a first elongated portion, a second diffusion region including a second elongated portion, a third diffusion region including a third elongated portion, and a fourth diffusion region including a fourth elongated portion;
 a first channel region located between the first and third elongated portions, wherein the first channel region and the first and third elongated portions form part of a first transistor;
 a second channel region located between second and third elongated portions, wherein the second channel region and the second and third elongated portions form part of a second transistor;
 a third channel region located between the second and fourth elongated portions, wherein the third channel region and the second and fourth elongated portions form part of a third transistor;
 a gate located over the first, second, and third channel regions, wherein the gate is shared by the first, second, and third transistors; and
 a conductive line electrically coupled to the first and fourth diffusion regions.

\* \* \* \* \*